(12) United States Patent
van der Wal et al.

(10) Patent No.: US 9,096,451 B2
(45) Date of Patent: Aug. 4, 2015

(54) APPARATUS AND METHOD FOR REMOVAL OF IONS

(71) Applicant: VOLTEA B.V., Sassenheim (NL)

(72) Inventors: Albert van der Wal, Oegstgeest (NL); Hank Robert Reinhoudt, Delft (NL); Bart Van Limpt, Leiden (NL); Thomas Richard Bednar, Brookfield, WI (US); George Shoemaker Ellis, Brookfield, WI (US); David Jeffrey Averbeck, Brookfield, WI (US)

(73) Assignee: VOLTEA B.V., Sassenheim (NL)

( * ) Notice: Subject to any disclaimer, the term of this patent is extended or adjusted under 35 U.S.C. 154(b) by 343 days.

(21) Appl. No.: 13/651,162

(22) Filed: Oct. 12, 2012

(65) Prior Publication Data
US 2013/0098766 A1    Apr. 25, 2013

(30) Foreign Application Priority Data

Oct. 14, 2011   (NL) .................................. 2007599

(51) Int. Cl.
| | |
|---|---|
| *C02F 1/469* | (2006.01) |
| *C02F 1/48* | (2006.01) |
| *H05K 13/00* | (2006.01) |
| *C02F 103/08* | (2006.01) |

(52) U.S. Cl.
CPC ................. *C02F 1/48* (2013.01); *C02F 1/4691* (2013.01); *H05K 13/00* (2013.01); *C02F 2103/08* (2013.01); *C02F 2201/4611* (2013.01); *C02F 2201/46105* (2013.01); *Y10T 29/49002* (2013.01)

(58) Field of Classification Search
CPC ........................................... C02F 1/461–1/4698
USPC .................................................. 204/660–674
See application file for complete search history.

(56) References Cited

FOREIGN PATENT DOCUMENTS

| | | | |
|---|---|---|---|
| WO | WO 01/89671 A1 * | 11/2001 | ............. B01D 61/42 |
| WO | WO 2013/055220 | 4/2013 | |
| WO | WO 2013/055221 | 4/2013 | |

\* cited by examiner

*Primary Examiner* — James Lin
*Assistant Examiner* — Ho-Sung Chung
(74) *Attorney, Agent, or Firm* — Pillsbury Winthrop Shaw Pittman LLP

(57) ABSTRACT

An apparatus to remove ions, the apparatus including a capacitive electrode stack. The capacitive electrode stack has a first electrode that includes a first current collector, a second electrode, and a spacer between the first and second electrodes to allow water to flow in between the first and second electrodes. The apparatus has a connector to connect the current collector inside the housing with an electrical source outside the housing, and the connector includes a closing off portion to close an opening in the housing and to form a boundary for the water in the housing.

20 Claims, 8 Drawing Sheets

APPARATUS AND METHOD FOR REMOVAL OF IONS

This application claims priority under 35 U.S.C. 119(a) to Netherlands Patent Application No. 2007599, filed Oct. 14, 2011, which is incorporated herein its entirety by reference.

FIELD

The invention relates to an apparatus to remove ions.

BACKGROUND

In recent years one has become increasingly aware of the impact of human activities on the environment and the negative consequences this may have. Ways to reduce, reuse and recycle resources are becoming more important. In particular, clean water is becoming a scarce commodity. Therefore, various methods and devices for purifying water have been published.

A method for water purification is by capacitive deionization, using an apparatus comprising a flow through capacitor (FTC) to remove ions in water. The FTC functions as an electrically regenerable cell for capacitive deionization. By charging electrodes, ions are removed from an electrolyte and are held in electric double layers at the electrodes. The electrodes may be charged with a voltage between 0.5 to 2 Volts. The electrodes may be (partially) electrically regenerated to desorb such previously removed ions without adding chemicals.

The apparatus to remove ions comprises one or more pairs of spaced apart electrodes (a cathode and an anode) and a spacer separating the electrodes and allowing water to flow between the electrodes. The electrodes have current collectors or backing layers that are generally adjacent to or very near the electrodes and a material to store the ions. Current collectors are electrically conductive and transport charge in and out of the electrodes.

The apparatus may have a housing comprising an inlet to let water into the housing and an outlet to let water out of the housing. In the housing, the layers of electrodes and spacers are stacked in a "sandwich" fashion by compressive force, normally by mechanical fastening.

SUMMARY

A problem with the apparatus to remove ions may be that it may be difficult to provide the charging voltage from outside the housing to the electrodes inside the housing.

It is an object, for example, to provide an improved apparatus to remove ions.

Accordingly, there is provided an apparatus to remove ions, the apparatus comprising:
a housing;
an inlet to let water enter into an interior of the housing;
an outlet to let water out of the interior of the housing;
a first electrode comprising a current collector;
a second electrode;
a spacer to separate the first and second electrodes and to allow water to flow in between the first and second electrodes;
a connector to connect the current collector inside the housing with an electrical source outside the housing, the connector comprising a closing off portion to close an opening in the housing in a water tight manner; and
a clamp to press the current collector against the closing off portion of the connector.

According to a further embodiment, there is provided a method of manufacturing an apparatus to remove ions, the apparatus comprising a housing and a stack in the housing, the stack comprising a first electrode having a current collector, a second electrode, and a spacer to separate the first and second electrodes and to allow water to flow in between the first and second electrodes, the method comprising:
providing a closing off portion in an opening in the housing; and
pressing the current collector against the closing off portion with a clamp to close the housing in a water tight manner and to electrically connect the closing off portion with the current collector.

These and other aspects, features and advantages will become apparent to those of ordinary skill in the art from reading the following detailed description and the appended claims. For the avoidance of doubt, any feature of one aspect of the present invention may be utilized in any other aspect of the invention. It is noted that the examples given in the description below are intended to clarify the invention and are not intended to limit the invention to those examples per se. Similarly, all percentages are weight/weight percentages unless otherwise indicated. Numerical ranges expressed in the format "from x to y" are understood to include x and y. When for a specific feature multiple preferred ranges are described in the format "from x to y", it is understood that all ranges combining the different endpoints are also contemplated.

BRIEF DESCRIPTION OF THE FIGURES

Embodiments of the invention will be described, by way of example only, with reference to the accompanying schematic drawings in which corresponding reference symbols indicate corresponding parts, and in which.

DETAILED DESCRIPTION

Figure 1:
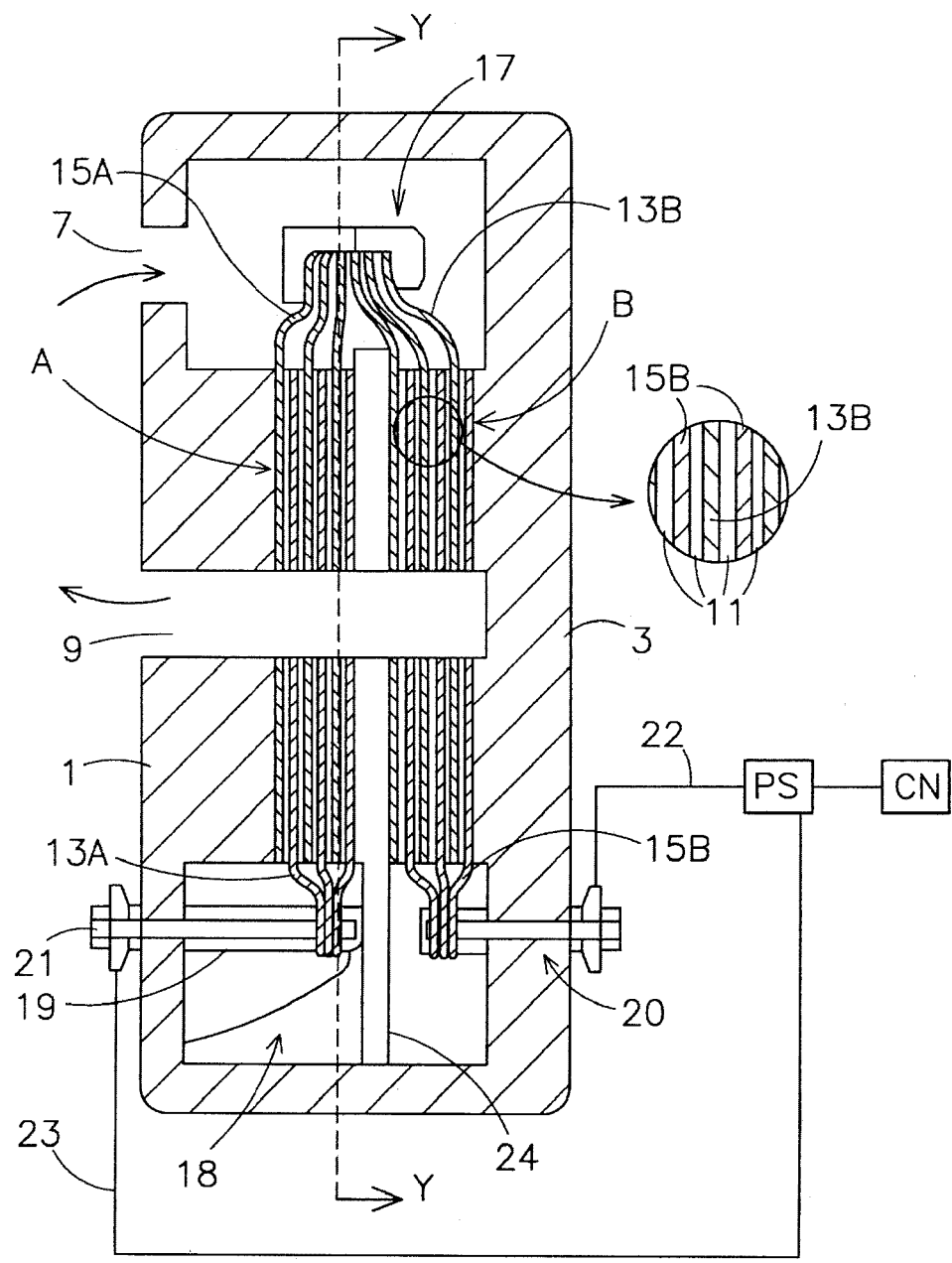
FIG. 1 shows a schematic cross-section of an apparatus to remove ions according to an embodiment.

FIG. 1 shows a schematic cross-section of an apparatus to remove ions according to an embodiment, which comprises two capacitive electrode stacks of first electrodes and second electrodes separated by spacers 11. The apparatus may have a housing comprising a first housing part 1 and a second housing part 3 made of a relatively hard material e.g. a hard plastic. By pressing the first and second housing parts onto each other, for example with a bolt and nut (not shown) the housing may be made water tight. Adhesive, a seal or an O-ring may be used to improve the water tightness of the housing.

The housing has a water inlet 7 and a water outlet 9. During ion removal from the water, the water will flow from the inlet 7 to the outlet 9 through the spacer 11 which separates the first electrode and the second electrode from each other. In the example the current collectors of the electrodes of two different stacks are clamped together inside the housing. In principle the current collectors can be clamped either inside or outside the housing. Nevertheless, clamping the current collectors inside the housing may have an advantage that stacks can be placed electrically in series without the need to make holes in the housing which helps to provide a substantially water leakage free apparatus. By creating an electrical potential difference between the first and second electrodes, for example by applying a positive voltage to the first electrode (the anode) 13 and a negative voltage to the second electrode (cathode) 15, anions in the water flowing through the spacer 11 are attracted to the first electrode and cations are attracted to the second electrode. In this way the ions (anions and cations) can be removed from the water flowing through the spacer 11. The electrical potential difference can also be created by e.g. applying a positive voltage to the first electrode (the anode) 13 and a lower positive voltage to the second electrode (cathode) 15. Also in this way the ions (anions and cations) can be removed from the water flowing through the spacer 11. In the example of FIG. 1 the two capacitive electrode stacks are electrically placed in series, whereas the flow paths, which are determined by the spacers 11, are substantially parallel. This means that the water may flow from the water inlet 7 to the water outlet 9 via the flow path of the first and/or second stack, which stacks are placed in the same housing.

The electrical potential difference between the first and second electrodes of the first capacitive electrode stack may be rather low, for example lower than 2 Volts, lower than 1.7 Volts or lower than 1.4 Volts. An advantage of placing FTC stacks electrically in series is that the potential difference over multiple capacitive electrode stacks may be higher than that between the first and the second electrodes. For example, the potential difference over two capacitive electrode stacks A and B, respectively having first and second electrodes 13A, 13B, 15A, 15B and a spacer 11, which are electrically connected in series may be twice as high than the potential difference over one single capacitive electrode stack or two capacitive electrode stacks A and B which are placed in a parallel electrical circuit. The current collector of the first electrode 13A of a first capacitive electrode stack may be connected to an electrical power source PS for example and the current collector of the second electrode 15A of the first capacitive electrode stack may be connected to the current collector of the first electrode 13B of the second capacitive electrode stack. The connection may be directly, and may be accomplished by clamp 17, which may desirably be made from a non-electrically conductive material since its function is to press the conductive current collectors of the second and first electrode 15A, 13B together so that the current is directly transported between the two current collectors. Alternatively clamp 17 may be made from an electrically conductive material or may contain parts that are electrically conductive. The second electrode 15A of a first capacitive electrode stack may substantially have the same potential as the first electrode 13B of the second capacitive electrode stack. The current collector of the second electrode 15B may also be connected to the electrical power source PS in order to complete the electrical circuit.

The current collectors of the first electrode 13A are clamped between clamp portions 19. The clamp portions 19 may be made from plastic, but could also be made from carbon, for example graphite blocks. The clamp portions 19 may have a ratchet mechanism to secure the clamp portions 19 with respect to each other and to optimize the contact surface between the current collector 13A and the clamp portions 19 to optimize electrical conductivity. To make the first connector 18, two clamp portions 19 may be pressed against multiple current collectors of the first electrode 13A so as to press the current collectors together and provide an electrical connection, subsequently an adhesive may be used to permanently fix the clamp portions 19 with the current collectors in a watertight manner. Alternatively or additionally a screw 21 may be used to press the current collectors 13 together with the clamp portions 19 and at the same time avoiding water/metal contact of the connector. For a low electrical resistance it is advantageous to make the contact surface of the current collector and the connector of the same or similar material, for example carbon. An advantage of carbon is that it does not corrode in the water and that it is relatively cheap compared to other non-corrosive materials and metals.

The pressure to clamp the current collector onto the connector may be at least 0.1 bar or at least 0.5 bar and less than 15 bar, less than 10 Bar or less than 5 Bar. The connector 18 may be glued against the housing so as to avoid contact of the water in the housing with the screw 21 which may be made out of metal. In this way corrosion of the screw may be prevented. In a similar way the current collector of the second electrode 15B of the second stack may be connected to the power source PS with a second connector 20. The potential difference delivered by the power source PS between the current collectors of the first electrode 13A of the first capacitive electrode stack via first cable 23 and the current collector of the second electrode 15B of the second capacitive electrode stack via second cable 22 may be, for example lower than 4 Volts, lower than 3.4 Volts or lower than 2.8 Volts.

A potential problem of the relatively high potential difference between the first and second connectors 18, 20 may be a potential leak current between the first and the second connectors. This may be reduced or prevented by placing an insulator between the two connectors. This insulator 24 may also be placed between the two connectors as well as between the first and second stacks. The insulator 24 may be an insulator to reduce or prevent electrical and/or ionic transport. By placing the capacitive electrode stacks electrically in series, the applied potential difference between the first and second connectors 18, 20 may be increased or even doubled, whereas at the same time the current through the cables 22, 23 may be reduced by as much as 50%. The energy efficiency of the FTC apparatus may therefore be improved and the need for very thick expensive cables may be reduced. At the same time a cheaper power source PS may be used that transports less current at a higher voltage.

By assuring that the electrical resistance of the first and second capacitive electrode stacks A and B are substantially the same, the potential difference as delivered by the power source PS may be substantially equally divided over the first and second capacitive electrode stacks A, B. As a consequence the potential difference between the first electrode 13A and second electrode 15A of the first capacitive electrode stack A may be substantially the same as the potential difference between the first electrode 13B and second electrode 15B of the second capacitive electrode stack B. This potential difference may be, for example, lower than 2 Volts, lower than 1.7 Volts or lower than 1.4 Volts.

A feed through or opening may be provided through the housing at a position where the first and second connectors 18, 20 are positioned against the housing 1,3. The feed through may have a metal screw 21 on which the cable 23 may be connected to the electrical power source PS. The power source PS may be controlled by controller CN to control the operation of the apparatus to remove ions.

The electrodes may be made substantially metal free to keep them corrosion free in the wet interior of the housing and at the same time cheap enough for mass production. The electrodes may be produced from a current collector 13A, B, 15A, B having a substantially metal free electrically conductive high surface area layer, which may contain activated carbon, carbon nanotubes, carbon aerogel, carbon black and/or graphene on both sides which are in contact with the water. The high surface area layer may be provided as a coating onto the current collector or as a separate film. A high surface area layer is a layer with a high surface area in square meters per weight of layer material e.g. >500 $m^2$/gr.

If the electrodes are saturated with ions the electrodes may be regenerated by reducing or even reversing the potential difference and discharging the electrical charge on the electrodes. This may result in the release of ions from the electrodes into the water flowing through the spacer. The increased ion content in the water in the spacer can be flushed out of the spacer. Once most ions are released from the electrodes and the water with increased ion content is flushed out of the spacer, the electrodes are regenerated and can be used again for attracting ions.

Figure 2:
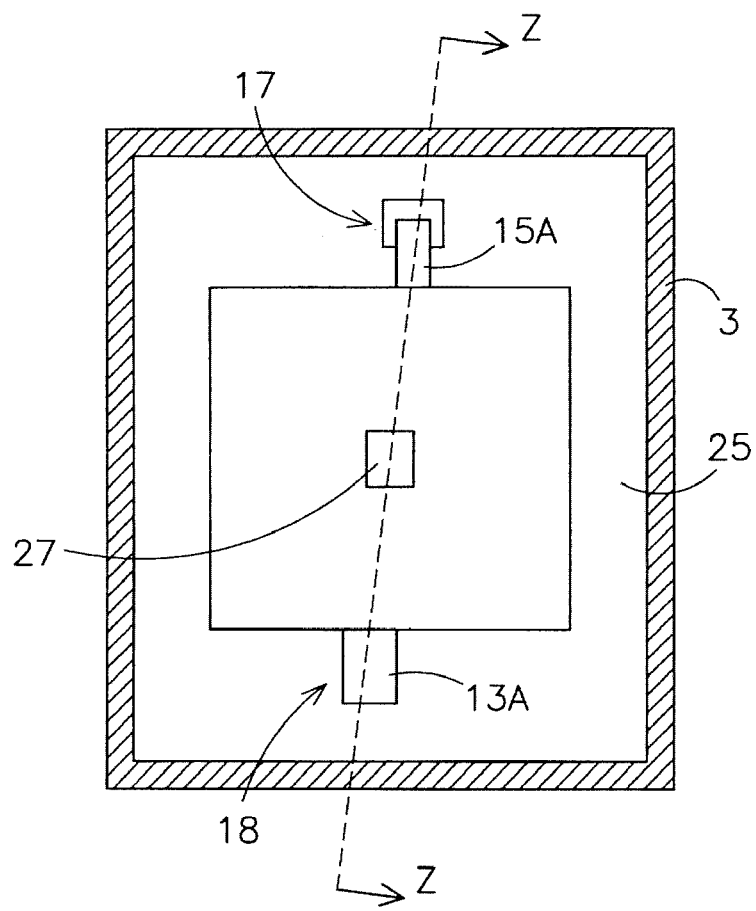
FIG. 2 shows a schematic cross-section along the line Y-Y of the apparatus of FIG. 1.

FIG. 2 depicts the cross-section along line Y-Y of the apparatus of FIG. 1. It shows the clamp 17 clamping the current collectors of the first and second electrode 15A and 13B (see FIG. 1). The housing has a space 25 to allow water to flow around the electrodes and the spacers 11 and a second passage 27 to allow water to collect from all the spacers 11 and flow through the outlet 9 (of FIG. 1). The first connector 18 is also shown. FIG. 1 is a cross section along the line Z-Z of FIG. 2.

Figure 3:
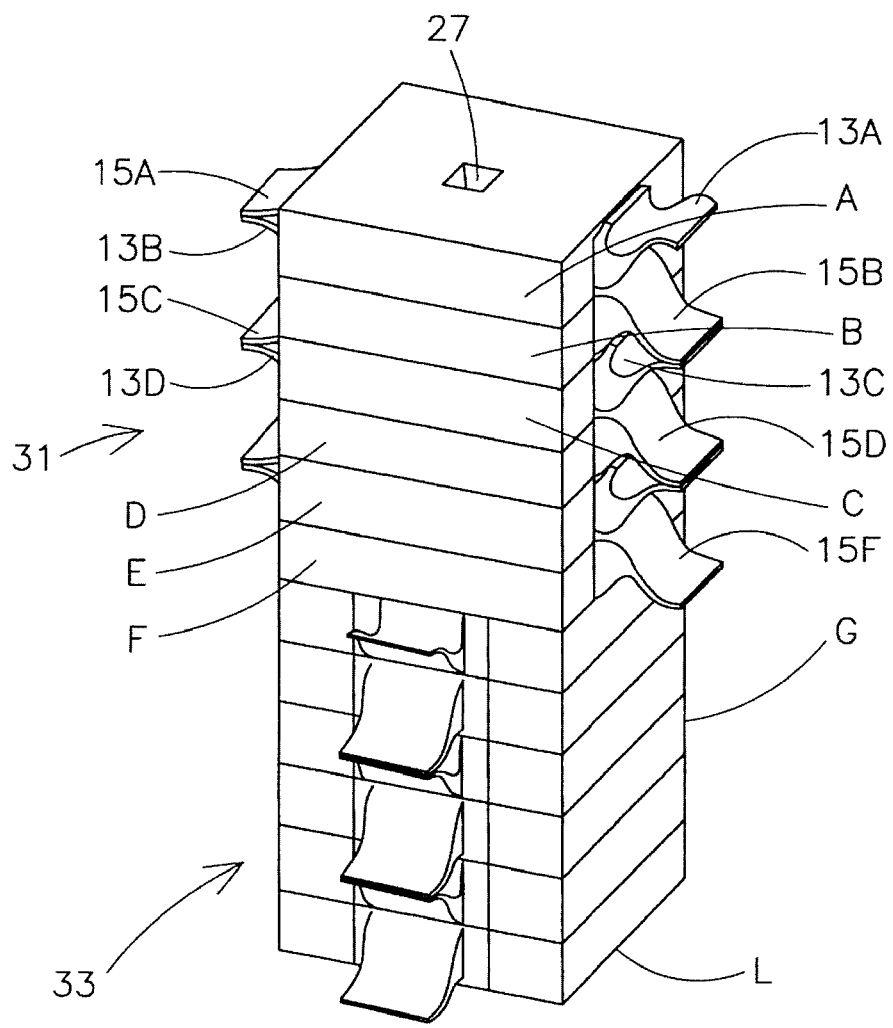
FIG. 3 shows a schematic three dimensional figure of an apparatus to remove ions according to a further embodiment.
Figure 4:
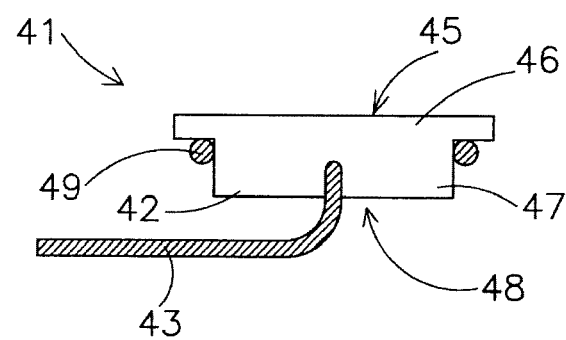
FIG. 4 depicts a connector according to an embodiment.

FIG. 3 shows a schematic three dimensional figure of an apparatus to remove ions according to a further embodiment with 12 capacitive electrode stacks A, B, C, D, etc. Each capacitive electrode stack A, B, C, D . . . has a respective first electrode 13A, 13B, 13C, 13D, etc. and a respective second electrode 15A, 15B, 15C, 15D, etc. The capacitive electrode stacks have an opening 27 to allow water to enter or exit the capacitive electrode stacks. A first group 31 of capacitive electrode stacks A . . . F is connected in series and a second group 33 of capacitive electrode stacks G . . . L is also connected in series. The potential difference that may be applied between the first electrode 13A of the first capacitive electrode stack A and the second electrode 15F of the last capacitive electrode stack F of the first group 31 may be 6 times the potential difference of a single capacitive electrode stack. The potential difference between the first electrode 13A of the first stack A and the second electrode 15F of the last capacitive electrode stack F of the first group 31 may therefore be, for example, lower than 12 Volts, lower than 9.4 Volts or lower than 8.4 Volts. Clamps (not shown) may be used to press the current collector of a second electrode 15A to a current collector of a first electrode 13B. FIG. 4 depicts a connector according to an embodiment. The connector 41 may be used to connecting a current collector of the apparatus to remove ions to a power source with a cable or lead 43. The connector 41 may have a closing off portion or contact member 47 to be placed in the housing to close an opening in the housing of the apparatus. The connector 41 may have a connector surface or contact face 45 defined in a head 46 of a contact portion adjacent to the interior of the housing which may be pressed against the current collector to provide an electrical contact. The closing off portion or contact member 47 of the connector 41 may comprise carbon, such as graphite, so as to avoid corrosion and provide a good electrical contact with the carbon current collector of the electrodes. The closing off portion may comprise a conductive polymer. The connector 41 may have a flexible material or seal 49 to provide a watertight connection with the housing. The seal 49 may be an o-ring, for example made of rubber, to provide a water tight connection with the housing. The o-ring may comprise a flexible material provided between the closing off portion of the connector and an area of the housing surrounding the opening so as to close the opening in a water tight manner. The cable or lead 43 may be provided in a connector portion having a neck 42 extending from the head in a direction away from the contact face 45 and having a receptacle at a dry surface 48 of the connector portion so as to avoid corrosion of the cable or lead 43. The lead or cable 43 may be engaged with the neck of the connector portion and is capable of directing an electrical current to the contact member via the head. The contact portion is configured to engage with the stack so that the contact member is in electrical communication with the stack. The contact portion may be substantially cylindrical and may define the contact face 45. The perimeter of the contact face 45 may form an arcuate rim. The contact portion may include a recess inward of the perimeter and a protrusion extending from the recess that terminates substantially coplanar with the rim. The contact face and the protrusion may be substantially cylindrical. The housing further may have a recess proximate to the opening, and the contact portion may be seated in the recess. The connector or contact member 47 is press fit or adhered to the opening. A seal portion may be defined by the head and/or the neck such that the seal portion establishes a hydraulic seal between the seal portion and a mount into which the electrical connector is seated during operation.

Figure 5:
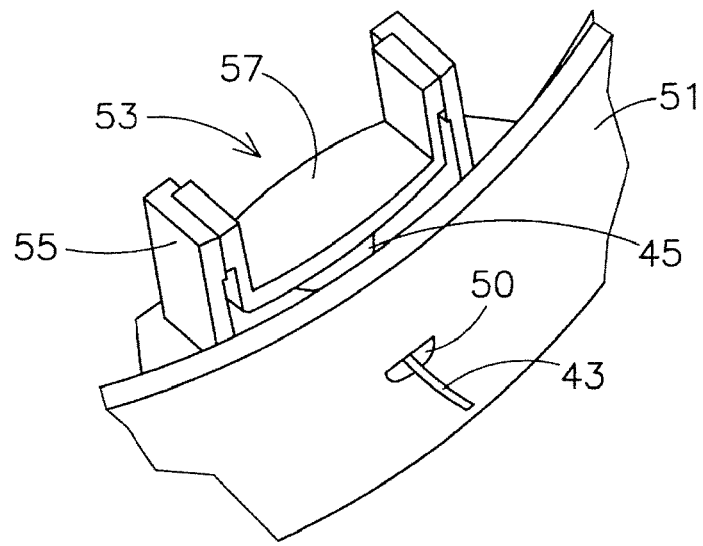
FIG. 5 depicts the connector of FIG. 4 provided in a ring of a housing.
Figure 6:
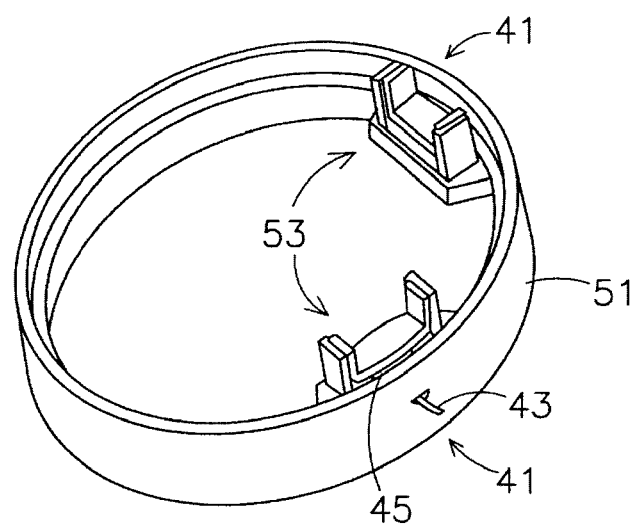
FIG. 6 shows a full ring for the housing of an apparatus to remove ions with two connectors of FIG. 4.

FIG. 5 depicts the connector of FIG. 4 provided in a ring 51 of the housing. The ring included a connector clamp 53 to clamp the electrode against the surface 45 of the connector. The connector clamp 53 may have a fixed part or protrusion member 55 which extends from an interior surface of the housing and may comprise a pair of arms. The connector clamp may also have a movable part or bridge 57 which is moveable along the pair of arms to adjust a pressure applied to the plurality of current collectors between the bridge 57 and the contact portion. The connector clamp may be sensitive to corrosion because there may be current and at the same time water surrounding the connector clamp. The connector clamp 53 may therefore be made from plastic e.g. polyethylene, polypropylene or polyvinylchloride. By making the connector clamp 53 from plastic the connector clamp may press the plurality of current collectors onto the contact surface without being sensitive to corrosion. Between fixed parts 55 and movable part 57 a ratchet mechanism may be provided. For example, the ratchet mechanism may comprise a surface with saw teeth which allows movement of the movable portion 55 in the direction of the connector but blocks movement of the movable portion 57 in opposite direction. The electrode may be provided in between the moveable portion 57 and the contact surface 45. By pressing the moveable portion 57 against the electrode and against the connector surface 45, a good connection will be provided between the electrode and the cable 43. FIG. 6 shows a full ring 51 for the housing with two connectors 41. The contact surface may define a contact face having a contact plane and the current collector of the electrode may have an electrode plane which may be substantially parallel to the contact plane. The opening 50 provided in the ring 51 of the housing may define an elbow passage having a first portion extending substantially perpendicular to a longitudinal axis of the housing and a second portion extending substantially parallel to the longitudinal axis. The closing off portion or contact member 47 may be seated in the second portion.

Figure 7:
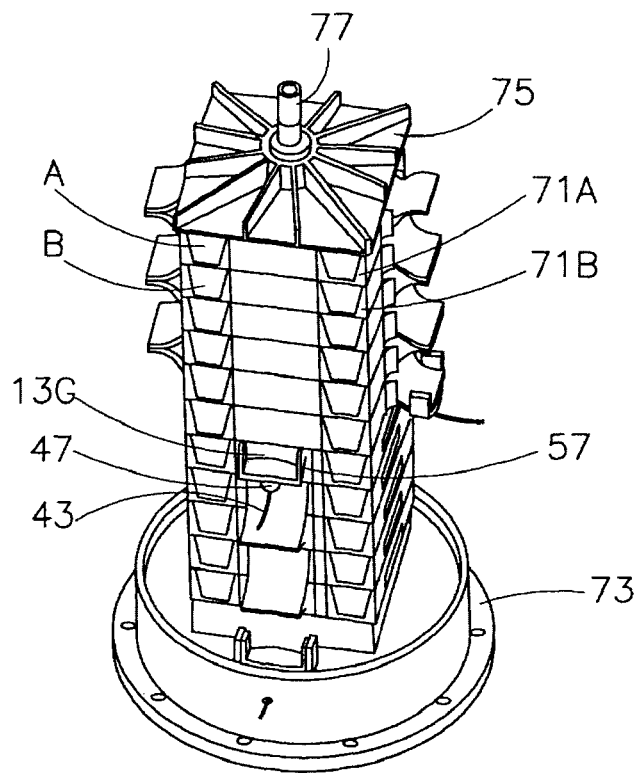
FIG. 7 depicts the stack of FIG. 3 wherein stack A, B are provided in a tray.

FIG. 7 depicts the capacitive electrode stack of FIG. 3 wherein capacitive electrode stack A, B include a tray 71A, 71B. The tray 71A, 71B may improve manufacturability because it may protect the electrodes during assembling of the capacitive electrode stacks in the housing. During manufacturing of one capacitive electrode stack the tray 71 may help in aligning the electrodes and/or the spacer. During use of the apparatus the tray may electrically and/or ionically insulate one capacitive electrode stack from another capacitive electrode stack and counteract leak currents.

The capacitive electrode stacks may be clamped between a bottom plate 73 and a pressure plate 75. A rod 77 may be provided through the opening 27 of the stacks and a nut may be provided which in cooperation with a thread on the rod may press the pressure plate 75 on the capacitive electrode stacks. Before pressing the pressure plate on the capacitive electrode stacks water may be flushed through the spacer along the electrodes. Flushing the stacks with water may comprise flowing water through the stacks with a pressure of between 0.5 and 10 bar, between 1 and 5 bar or between 2 and 4 bar. Flushing helps to remove any loose material out of the spacer and/or the membranes and/or the electrodes before the pressure is applied. After flushing the capacitive electrode stack will be compressed and the capacitive electrode stacks will be fixed in the housing. The capacitive electrode stacks may be fixated permanently. By exerting a force on the capacitive electrode stacks so as to compress the first and second electrodes and the spacer, the electrical resistivity may be decreased which may make the apparatus more efficient. It is desirable that the electrical resistivity is substantially equal for every capacitive electrode stack because otherwise the voltage is not substantially equally divided over the individual capacitive electrode stacks. If one capacitive electrode stack operates at higher voltage than another capacitive electrode stack then the capacitive electrode stack which receives a higher voltage may become damaged due to oxidation and/or electrolysis. Therefore the pressure should be equally divided for all the capacitive electrode stacks. The stacks may be compressed with a pressure of less than 5 bar, less than 2 bar, or between 1 bar and 0.5 bar.

The bottom plate 73 may form a part of the housing of the apparatus to remove ions. In FIG. 7 it is shown how the electrode 13G may be provided in between the moveable portion 57 and the closing off portion 47 of the connector clamp 53 to be electrically connected to the cable 43. A contact member may be seated in the base member or bottom plate 73 to define a contact portion and a connector portion extending from the contact portion. A lead may be engaged with the connector portion and capable of directing an electrical current to the contact member. A protrusion member may be extending from the base member or bottom plate 73 adjacent to the contact member. A compression member (similar as the design of FIG. 5) may be configured to selectively engage the protrusion member at a plurality of positions relative to the contact member such that the compression member may be adjusted to compress a current collector of the electrode between the compression member and the contact member. The compression member may include a resilient arm having a first interlocking member; and the protrusion member may include a second interlocking member, wherein the first interlocking member and the second interlocking member are configured to selectively engage such that first interlocking member of the compression member may be restrained relative to the contact member by the second interlocking member of the protrusion member. The first interlocking member may define a plurality of ramps and the second interlocking member may define a plurality of inverse ramps. The plurality of ramps and the plurality of inverse ramps may engage to inhibit separation of the protrusion member and the compression member.

Figure 8:
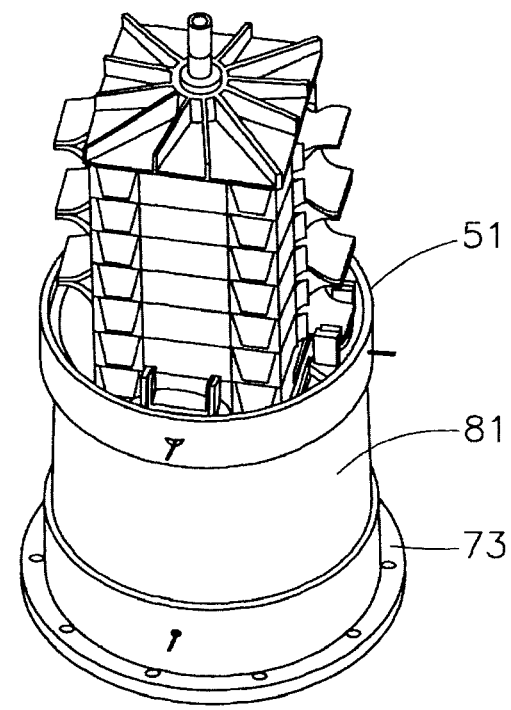
FIG. 8 depicts the apparatus after a first housing portion and the ring of FIG. 5 is provided.

In FIG. 8 a first housing portion 81, e.g. a round pipe section, is provided to the bottom plate 73 and the ring 51 of FIG. 6 is located on top of the section 81.

Figure 9:
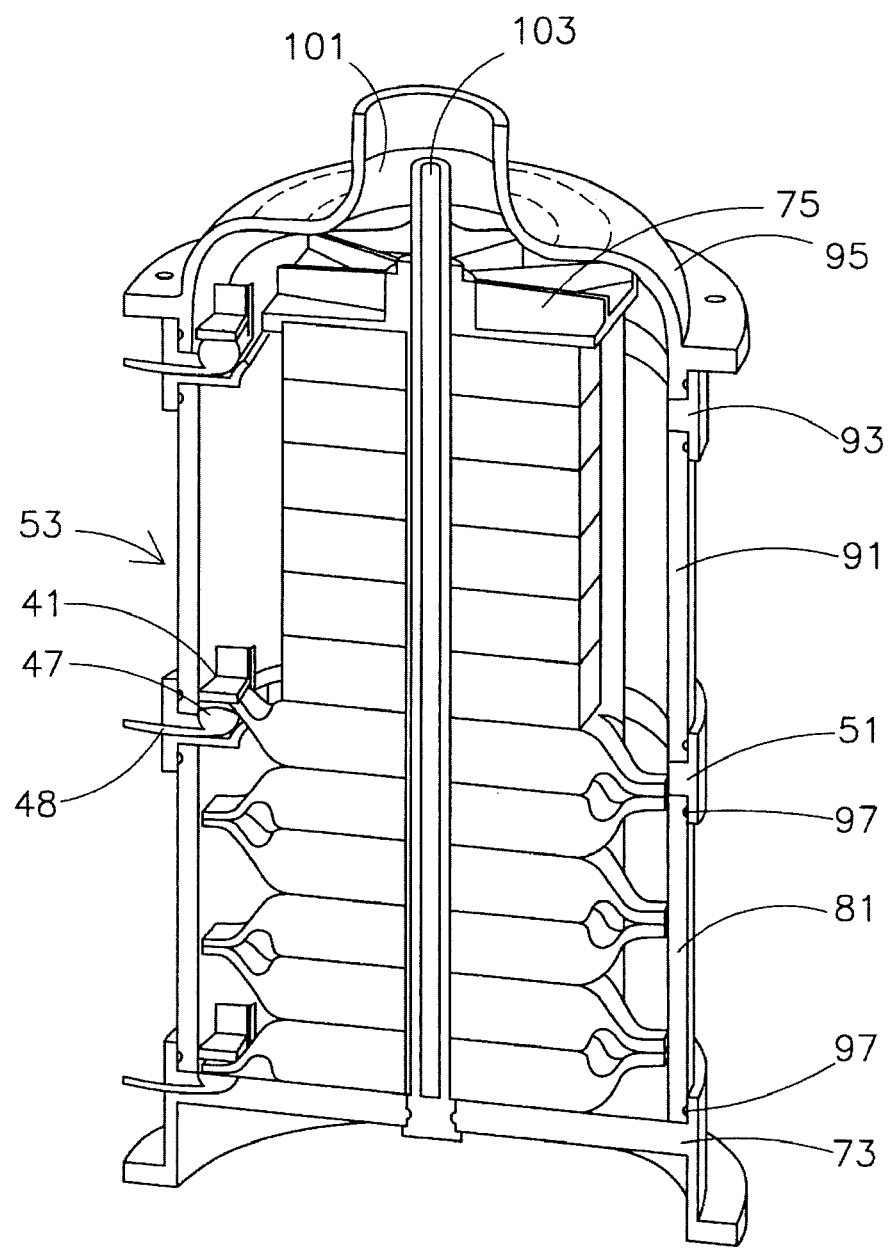
FIG. 9 shows a cross section of the apparatus of FIGS. 3 to 7.

FIG. 9 shows a cross section of the apparatus of FIGS. 3 to 7 after a second round pipe section 91 is provided on top of the ring 51, a second ring 93 is provided to the pipe section 91 and a top dome 95 is provided to the apparatus. The housing may be made water tight by providing flexible member 97, for example a rubber o-ring, in between the housing portion 81 and the ring 51 or between the housing portion 81 and the bottom plate 73. The dome opening 101 in the top dome 95 allows for water intake, for example from a water pipe, whereas opening 103 may be used for water outlet. The dome opening 101 may also be used for maintenance of the stacks. For example a socket wrench may be used to allow access through the dome opening 101 to tighten a nut cooperating with a thread provided to the rod 77. By tightening the nut the capacitive electrode stacks may be compressed between the bottom plate 73 and the pressure plate 75. Before compressing the pressure plate on the capacitive electrode stacks, water may be flushed through the spacer along the electrodes. Flushing helps to remove any loose material out of the spacer and/or the membranes and/or the electrodes, after which the capacitive electrode stack will be compressed. It is advantageous, for example, that the dome opening 101 in the top dome 95 allows for compressing the stack while the housing is filled with water. Also the dome opening 101 allows for the pressure to be adjusted at a later stage, for example during installation of the apparatus or during maintenance. Further the connector 41 located in an opening 48 in the ring 51 is shown. The clamp 53 presses the current collector of an electrode onto the connector 41 and thereby presses the closing off body 47 in the opening 48, thereby closing off the opening 48 for water inside the housing.

Figure 10A:
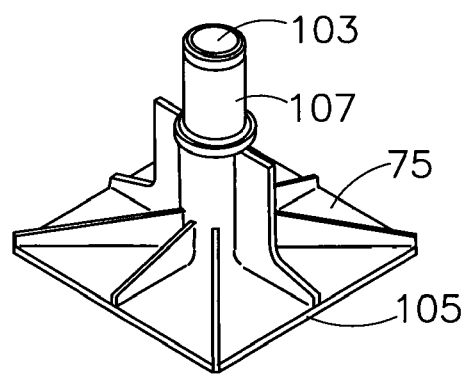
FIGS. 10a to 10b disclose a pressure plate according to an embodiment.
Figure 10B:
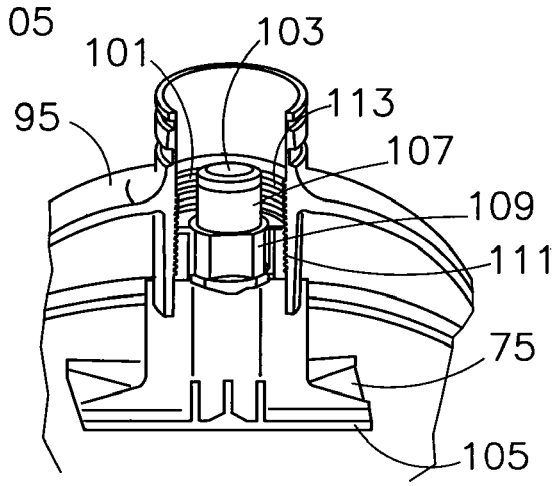
Figure 11A:
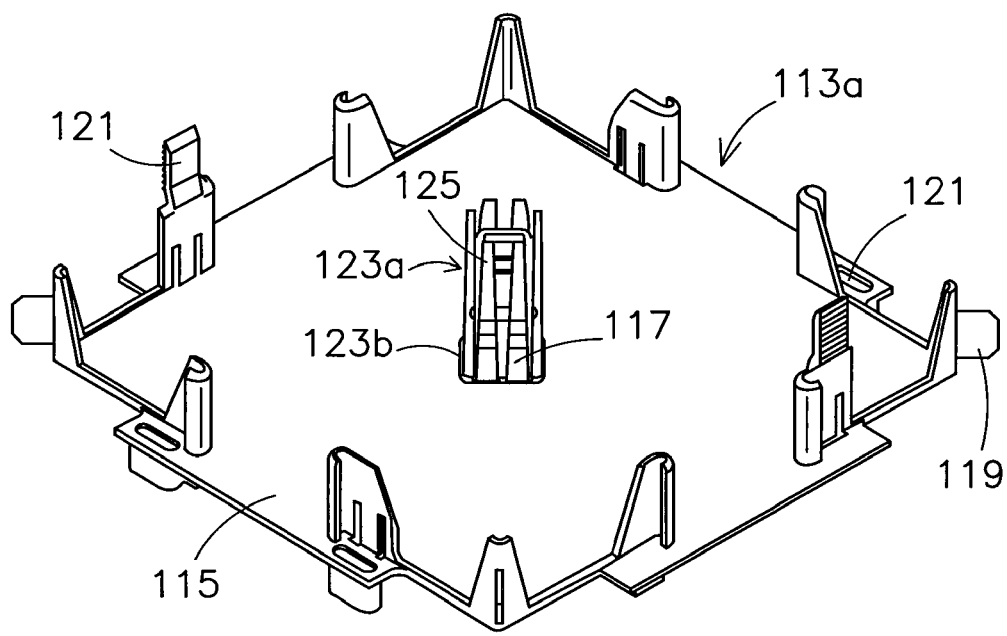
FIGS. 11a to 11d show a top view of a tray 113a for use in an embodiment.
Figure 11B:
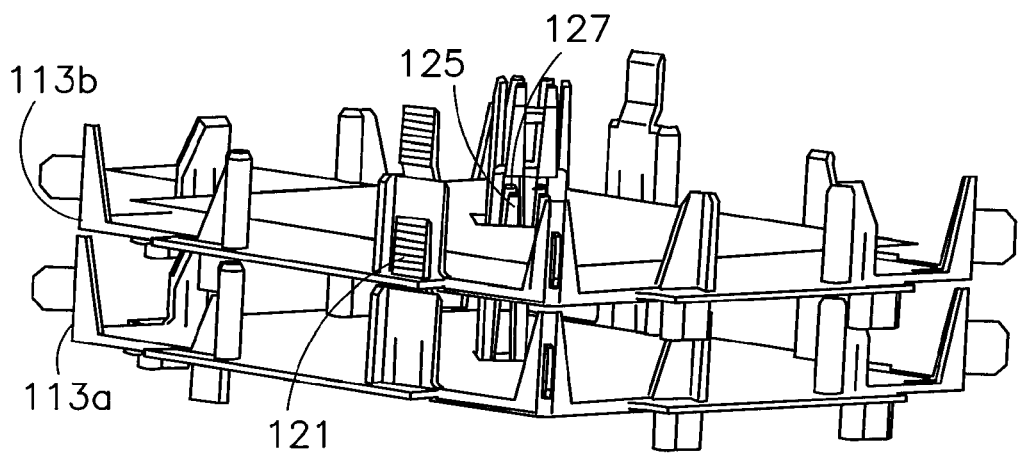
Figure 11C:
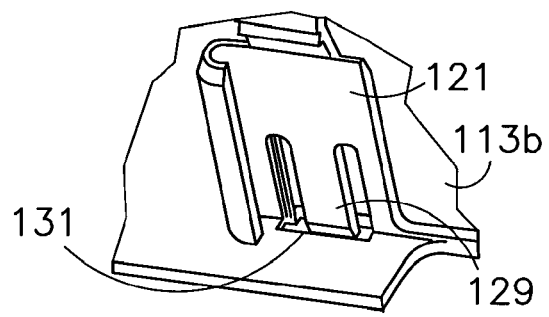
Figure 11D:
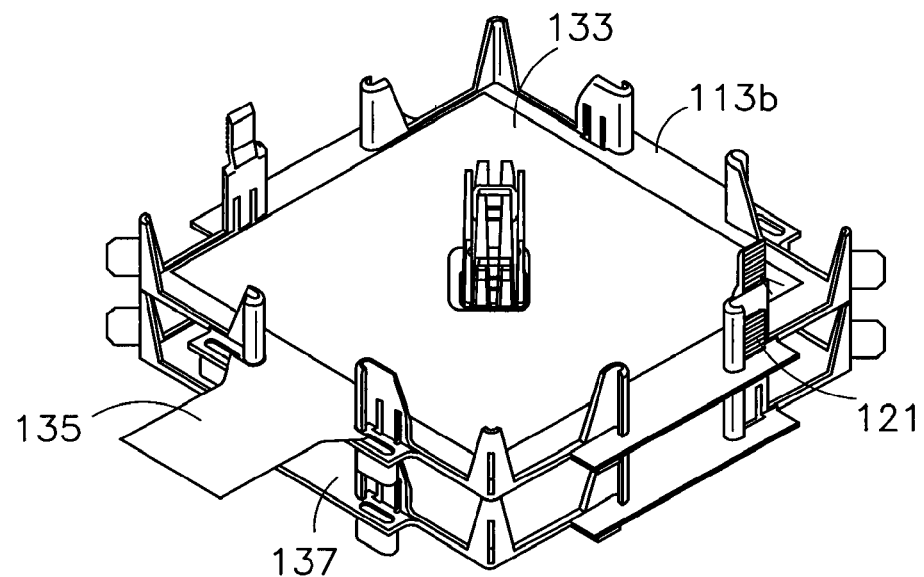

FIG. 10a depicts a pressure plate 75 according to an embodiment. The pressure plate 75 has a base 105 and a top portion 107. The top portion has an opening 103 to allow water to exit the stacks. FIG. 10b discloses how the pressure plate 75 of FIG. 10a may be used to compress the capacitive electrode stacks together. A compression member, for example a nut like object 109, may be accessed through the dome opening 101 to be tightened by rotating the nut like object with respect to the top dome 95. The nut like object 109 may have an external thread 111 to cooperate with an internal thread 113 provided to the top dome 95. By rotating the nut like object 109 the capacitive electrode stacks may be compressed between the bottom plate 73 and the pressure plate 75. The nut like object 109 may have a hole or cut out to allow water to pass through and to provide grip to rotate the nut like object 109. In the center of the nut like object there is provided a hole in which the top portion 107 of the pressure plate 75 rotatably fits. The pressure plate 105 may have an interface between the housing and the pressure plate to inhibit a rotation of the pressure plate 105 relative to the housing. The interface may have a projection extending from the pressure plate or the housing; and a receiver formed in the other of the pressure plate or the housing to inhibit a rotation. The top portion may define an annular lip 110 and the compression member may define an end face; and the end face of the compression member may engage the annular lip 110 of the top portion to compress the stack.

Before compressing the pressure plate on the capacitive electrode stacks, water may be flushed through the spacer along the electrodes to hydrate the stack. Hydrating and/or flushing helps to remove any loose material out of the spacer, after which the capacitive electrode stack will be compressed. It is advantageous that the dome opening 101 in the top dome 95 allows for the compression to take place because the capacitive electrode stacks may be compressed after the housing has been filled with water. Also during maintenance the compression may be adjusted via the dome opening 101. The top dome 95 which is dome shaped may include a neck that extends into the interior. Internal threads may be formed on an interior surface of the neck; and external threads may be formed on an exterior surface of the compression member. The internal threads and the external threads are configured to engage, such that rotation of the compression member around the longitudinal axis may move the compression member along a longitudinal axis of the housing. A longitudinal slit, receiver or a slot may be formed in the neck and a radial tab 108 may be extending from the top portion 107 wherein the longitudinal slit and the radial tab are configured to interface, such that rotation of the pressure plate 75 relative to the housing is inhibited.

FIG. 11 a shows a top view of a tray 113a for use in an embodiment. The tray 113a may comprise a main surface 115 to receive a capacitive electrode stack. The tray 113a may include an opening 117 as an alignment feature, which may be used to slide the tray along the rod 77 (See FIG. 7), and to provide water to, or remove water from, the interior of the capacitive electrode stack. The opening 117 may be constructed and arranged to cooperate with the rod 77, for example the size of the opening and the rod 77 may be substantially matching. The tray 113a may have one or more additional alignment features for alignment with the capacitive electrode stack, the rod, the housing, and/or other trays. Alignment features such as a protrusion 119 may be used to align the tray 113a with the housing, or keep it at a substantially constant distance from the housing. Another example of an alignment feature may be tab 121 comprising teeth and provided to the first tray 113a to interlock the tray with a second tray positioned on top of the first tray 113a. Surrounding the opening 117 there may be provided as alignment features a first and second pillar structure 123a and 123b respectively, both pillar structures may have pillars and holes. The pillars 125 of the first pillar structure 123a may align with the holes 127 of a second pillar structure provided to a second tray 113b (See FIG. 11b). The tabs 121 with teeth of the first tray 113a may protrude through an opening in the second tray 113b and the teeth of the first tray may interlock with an edge of the opening of the second tray 113b. A spring 129 (see FIG. 11c) may be provided to the tab 121 of the second tray 113b to press the teeth (not shown) against the edge 131. FIG. 11d shows how the teeth of the tab 121 interlock with second tray 113b. Further a first electrode 133 is shown with a first current collector 135 and is positioned within the tray and is aligned by the alignment features of the second tray 113b. The first current collector 135 is protruding outside the second tray 113b so that it may be connected to other current collectors. The second tray 113b may have an opening 137 which may interlock with a clamp (not shown) which clamps the first current collector of the second tray 113b to the second current collector of another tray. The trays may function as an electrical insulator between capacitive electrode stacks. By interlocking a number of trays each having a capacitive electrode stack and by connecting the current collectors to each other the capacitive electrode stack may be assembled together. Subsequently, the capacitive electrode stacks may be put into a housing and flushed with water. After flushing the capacitive electrode stacks the stacks may be compressed by rotating the nut like object 109 of FIG. 10 and the capacitive electrode stacks may be compressed between the bottom plate 73 and the pressure plate 75.

While specific embodiments of the invention have been described above, it will be appreciated that the invention may be practiced otherwise than as described. For example, the invention may take the form of a computer program containing one or more sequences of machine-readable instructions describing a method as disclosed herein, or a data storage medium (e.g. semiconductor memory, magnetic or optical disk) having such a computer program stored therein.

Embodiments are also provided in the following numbered clauses:

1. A capacitive deionization device, comprising:
    a housing defining an opening between an interior of the housing and an exterior of the housing;
    a stack within the housing;
    a contact member seated in the opening and defining a contact portion adjacent to the interior of the housing and a connector portion adjacent to the exterior of the housing; and
    a lead engaged with the connector portion and capable of directing an electrical current to the contact member,
    wherein the contact portion is configured to engage the stack such that the contact member is in electrical communication with the stack.
2. The capacitive deionization device of clause 1, wherein:
    the contact portion is substantially cylindrical and defines a contact face; and
    a perimeter of the contact face forms an arcuate rim.
3. The capacitive deionization device of clause 1 or 2, wherein:
    the contact portion defines a contact face having a rim about a perimeter of the contact face; and
    the contact face includes a recess inward of the perimeter, and a protrusion extending from the recess that terminates substantially coplanar with the rim.
4. The capacitive deionization device of clause 3, wherein:
    the contact face is substantially circular; and
    the protrusion is substantially cylindrical.
5. The capacitive deionization device of any of clauses 1 to 4, wherein:
    the connector portion is substantially cylindrical; and
    a receptacle is formed in the connector portion such that the lead is engaged within the receptacle.
6. The capacitive deionization device of any of clauses 1 to 5, wherein:
    the housing further defines a recess proximate the opening; and
    the contact portion of the contact member is seated in the recess.
7. The capacitive deionization device of any of clauses 1 to 6, wherein the contact member is press fit in the opening and/or adhered in the opening.
8. The capacitive deionization device of any of clauses 1 to 7, wherein the device comprises a seal formed between the contact member and the opening such that a fluid within the interior of the housing is inhibited from flowing through the opening toward the exterior of the housing.
9. The capacitive deionization device of clause 8, wherein the seal includes an o-ring seated in an annular channel formed in a radial face of the contact portion.

10. The capacitive deionization device of any of clauses 1 to 9, wherein the apparatus further comprises:
   a plurality of electrodes within the stack;
   a protrusion member extending from an interior surface of the housing; and
   a compression member configured to selectively engage the protrusion member at a plurality of positions relative to the contact member such that the compression member may be adjusted to compress the plurality of electrodes between the compression member and the contact portion of the contact member.

11. The capacitive deionization device of clause 10, wherein:
   the protrusion member includes a pair or arms;
   the compression member includes a bridge spanning between the pair or arms; and
   the bridge is moveable along the pair of arms to adjust a pressure applied to the plurality of electrodes between the bridge and the contact portion.

12. The capacitive deionization device of any of clauses 1 to 11, wherein:
   the stack includes an electrode having an electrode plane;
   the contact portion defines a contact face having a contact plane; and
   the electrode plane and the contact plane are substantially parallel.

13. The capacitive deionization device of any of clauses 1 to 12, wherein:
   the opening defines an elbow passage having a first portion extending substantially perpendicular to a longitudinal axis of the housing and a second portion extending substantially parallel to the longitudinal axis; and
   the contact member is seated in the second portion.

14. The capacitive deionization device of any of clauses 1 to 14, wherein the contact member is at least partially formed of graphite.

15. An electrical connector assembly, comprising:
   a base member;
   a contact member seated in the base member and defining a contact portion and a connector portion extending from the contact portion;
   a lead engaged with the connector portion and capable of directing an electrical current to the contact member;
   a protrusion member extending from the base member adjacent to the contact member; and
   a compression member configured to selectively engage the protrusion member at a plurality of positions relative to the contact member such that the compression member may be adjusted to compress an electrode between the compression member and the contact member.

16. The electrical connector assembly of clause 15, wherein:
   the contact portion is substantially cylindrical and defines a contact face; and
   a perimeter of the contact face forms an arcuate rim.

17. The electrical connector assembly of clause 15 or 16, wherein:
   the contact portion defines a contact face having a rim about a perimeter of the contact face; and
   the contact face includes a recess inward of the perimeter, and a protrusion extending from the recess that terminates substantially coplanar with the rim.

18. The electrical connector assembly of any of clauses 15 to 17, wherein:
   the contact face is substantially circular; and
   the protrusion is substantially cylindrical.

19. The electrical connector assembly of any of clauses 15 to 18, wherein:
   the connector portion is substantially cylindrical; and
   a receptacle is formed in the connector portion such that the lead is engaged within the receptacle.

20. The electrical connector assembly of any of clauses 15 to 19, wherein:
   the base member defines a recess; and
   the contact portion of the contact member is seated in the recess.

21. The electrical connector assembly of clause 20, wherein the contact member is press fit in the recess and/or adhered in the recess.

22. The electrical connector assembly of clause 20, further comprising a seal formed between the contact member and the recess such that a fluid is inhibited from flowing past the seal.

23. The electrical connector assembly of clause 22, wherein the seal includes an o-ring seated in an annular channel formed in a radial face of the contact portion.

24. The electrical connector assembly of any of clauses 15 to 23, wherein:
   the protrusion member includes a pair of arms;
   the compression member includes a bridge spanning between the pair of arms; and
   the bridge is moveable along the pair of arms to adjust a pressure applied to the electrode between the bridge and the contact portion of the contact member.

25. The electrical connector assembly of any of clauses 15 to 24, wherein:
   the compression member includes a resilient arm having a first interlocking member; and
   the protrusion member includes a second interlocking member; and
   the first interlocking member and the second interlocking member are configured to selectively engage such that first interlocking member of the compression member may be restrained relative to the contact member by the second interlocking member of the protrusion member.

26. The electrical connector assembly of any of clauses 15 to 25, wherein:
   the first interlocking member defines a plurality of ramps;
   the second interlocking member defines a plurality of inverse ramps; and
   the plurality of ramps and the plurality of inverse ramps engage to inhibit separation of the protrusion member and the compression member.

27. The electrical connector assembly of any of clauses 15 to 26, wherein:
   the contact portion defines a contact plane;
   the compression member defines a compression plane; and
   the contact plane and the compression plane are substantially parallel.

28. The electrical connector assembly of any of clauses 15 to 27, wherein:
   the base member includes an opening that defines an elbow passage having a first portion extending substantially perpendicular to a wall of the base member and a second portion extending substantially parallel to the wall; and
   the contact member is seated in the second portion.

29. The electrical connector assembly of any of clauses 15 to 28, wherein the contact member is at least partially formed of graphite.

30. An electrical connector, comprising:
   a contact portion having a head that defines a contact face;
   a connector portion having a neck extending from the head in a direction away from the contact face;
   a lead engaged with the neck and capable of directing an electrical current to the head; and a seal portion defined by the head, the neck, or both, such that the seal portion establishes a hydraulic seal between the seal portion and a mount into which the electrical connector is seated during operation.
31. The electrical connector of clause 30, wherein:
the head is substantially cylindrical; and
the neck is substantially cylindrical.
32. The electrical connector of clause 30 or 31, wherein a perimeter of the contact face forms an arcuate rim.
33. The electrical connector of any of clauses 30 to 32, wherein the contact face further comprises:
a rim about a perimeter of the contact face;
a recess inward of the perimeter; and
a protrusion extending from the recess that terminates substantially coplanar with the rim.
34. The electrical connector of any of clauses 30 to 33, wherein:
the contact face is substantially circular; and
the protrusion is substantially cylindrical.
35. The electrical connector of any of clauses 30 to 34, wherein:
the connector portion is substantially cylindrical; and
a receptacle is formed in the neck such that the lead is engaged within the receptacle.
36. The electrical connector of any of clauses 30 to 35, wherein the seal portion is defined by the head.
37. The electrical connector of clause 36, wherein the seal portion includes:
an annular channel formed in a radial face of the head; and
an o-ring seated in the annular channel.
38. The electrical connector of any of clauses 30 to 37, wherein the head defines an annular mounting face opposite to the contact face.
39. The electrical connector of any of clauses 30 to 38, wherein the contact portion is at least partially formed of graphite.
40. The electrical connector of clause 39, wherein the connector portion is at least partially formed of graphite.
41. The electrical connector of any of clauses 30 to 52, wherein the contact portion and the connector portion are integral.

The descriptions above are intended to be illustrative, not limiting. Thus, it will be apparent to one skilled in the art that modifications may be made to the invention as described without departing from the scope of the claims set out below.

The invention claimed is:
1. An apparatus to remove ions, the apparatus comprising:
a housing;
an inlet to let water enter into an interior of the housing;
an outlet to let water out of the interior of the housing;
a first electrode comprising a current collector;
a second electrode;
a spacer to separate the first and second electrodes and to allow water to flow in between the first and second electrodes;
a connector to connect the current collector inside the housing with an electrical source outside the housing, the connector comprising a closing off portion to close an opening in the housing in a water tight manner; and
a clamp to press the current collector against the closing off portion of the connector.
2. The apparatus according to claim 1, wherein the clamp presses the current collector against a substantially flat surface of the closing off portion of the connector.
3. The apparatus according to claim 1, wherein the clamp presses the closing off portion of the connector against the housing to close the opening in a water tight manner.
4. The apparatus according to claim 1, further comprising a flexible material between the closing off portion of the connector and an area of the housing surrounding the opening so as to close the opening in a water tight manner.
5. The apparatus according to claim 1, wherein the closing off portion is made from a material comprising carbon.
6. The apparatus according to claim 5, wherein the material comprises graphite.
7. The apparatus according to claim 1, wherein the closing off portion comprises a conductive polymer.
8. The apparatus according to claim 1, wherein the connector further comprises a metal portion connected to the closing off portion at a dry surface of the closing off portion.
9. The apparatus according to claim 8, wherein the closing off portion further comprises a hole in the dry surface of the closing off portion and the metal portion is connected to the closing off portion through the hole.
10. The apparatus according to claim 1, wherein the clamp comprises a plastic material.
11. The apparatus according to claim 1, wherein the clamp comprises a stationary part and a moveable part and the moveable part is moveable against the current collector to press the current collector against the closing off portion of the connector.
12. The apparatus according to claim 11, wherein the moveable part and the stationary part are constructed and arranged so that the moveable part is moveable in a first direction but blocked in an opposite direction.
13. The apparatus according to claim 12, wherein the moveable part and the stationary part form a ratchet mechanism to allow the moveable part to be moveable in a first direction but being blocked in the opposite direction.
14. A method of manufacturing an apparatus to remove ions, the apparatus comprising a housing, an inlet to let water enter into an interior of the housing, an outlet to let water out of the interior of the housing, a first electrode having a current collector, a second electrode, a spacer to separate the first and second electrodes and to allow water to flow in between the first and second electrodes, a clamp and a connector to connect the current collector inside the housing with an electrical source outside the housing, the connector comprising a closing off portion, the method comprising:
providing the closing off portion to close an opening in the housing in a water tight manner; and
pressing the current collector against the closing off portion with the clamp to electrically connect the closing off portion with the current collector.
15. The method according to claim 14, comprising pressing the current collector against a substantially flat surface of the closing off portion of the connector.
16. The method according to claim 14, further comprising pressing the closing off portion of the connector against the housing using the clamp to close the opening in a water tight manner.
17. The method according to claim 14, further comprising providing a flexible material between the closing off portion of the connector and an area of the housing surrounding the opening so as to close the opening in a water tight manner.
18. The method according to claim 14, wherein the closing off portion is made from a material comprising carbon or the closing off portion comprises a conductive polymer.
19. The method according to claim 14, wherein the clamp comprises a stationary part and a moveable part and wherein pressing the current collector comprising moving the moveable part against the current collector to press the current collector against the closing off portion of the connector.

20. The method according to claim 14, wherein the moveable part and the stationary part are constructed and arranged so that the moveable part is moveable in a first direction but blocked in an opposite direction.

* * * * *